(12) United States Patent
Platzer et al.

(10) Patent No.: US 8,132,939 B2
(45) Date of Patent: Mar. 13, 2012

(54) LED MODULE WITH APPLICATION-SPECIFIC COLOR SETTING

(75) Inventors: Christoph Platzer, Edelsbach (AT); Bernd Skopec, Heiligenkreuz im Lafnitztal (AT)

(73) Assignee: Ledon Lighting Jennersdorf GmbH, Jennersdorf (AT)

( * ) Notice: Subject to any disclaimer, the term of this patent is extended or adjusted under 35 U.S.C. 154(b) by 142 days.

(21) Appl. No.: 12/371,295

(22) Filed: Feb. 13, 2009

(65) Prior Publication Data
US 2009/0212313 A1 Aug. 27, 2009

(30) Foreign Application Priority Data

Feb. 26, 2008 (DE) .................. 20 2008 002 707 U
Apr. 21, 2008 (DE) .................. 20 2008 005 509 U

(51) Int. Cl.
*F21V 9/00* (2006.01)
(52) U.S. Cl. .................. 362/293; 362/125; 362/311.02
(58) Field of Classification Search .................. 362/231, 362/255, 256, 293, 311.02, 311.14; 257/98, 257/99, 100
See application file for complete search history.

(56) References Cited

U.S. PATENT DOCUMENTS

| | | | |
|---|---|---|---|
| 5,813,753 A | 9/1998 | Vriens et al. | |
| 6,521,915 B2 * | 2/2003 | Odaki et al. | 257/98 |
| 6,812,500 B2 | 11/2004 | Reeh et al. | |
| 7,011,421 B2 | 3/2006 | Hulse et al. | |
| 7,318,651 B2 | 1/2008 | Chua et al. | |
| 7,513,637 B2 * | 4/2009 | Kelly et al. | 362/125 |
| 2003/0137828 A1 * | 7/2003 | Ter-Hovhannisian | 362/92 |
| 2004/0173806 A1 * | 9/2004 | Chua | 257/98 |
| 2005/0211991 A1 | 9/2005 | Mori et al. | |
| 2006/0097245 A1 | 5/2006 | Aanegola et al. | |
| 2006/0285324 A1 * | 12/2006 | Ansems et al. | 362/231 |
| 2007/0114562 A1 | 5/2007 | Radkov et al. | |
| 2007/0171647 A1 * | 7/2007 | Artwohl et al. | 362/125 |
| 2008/0265268 A1 | 10/2008 | Braune et al. | |
| 2010/0079058 A1 * | 4/2010 | Schmidt et al. | 257/98 |

FOREIGN PATENT DOCUMENTS

| | | |
|---|---|---|
| DE | 196 38 667 | 4/1998 |
| DE | 199 21 684 | 11/2000 |
| DE | 10 2005 013 802 | 12/2005 |
| DE | 10 2005 045 106 | 6/2006 |
| DE | 10 2005 005 263 | 8/2006 |
| DE | 10 2006 020 529 | 3/2007 |
| DE | 10 2005 059 521 | 6/2007 |
| DE | 10 2006 036 577 | 2/2008 |
| DE | 603 16 569 | 7/2008 |
| JP | 2007088248 | 4/2007 |
| WO | WO-97/50132 | 12/1997 |

OTHER PUBLICATIONS

Search Report from DE 20 2008 005 509.1.

* cited by examiner

*Primary Examiner* — Y My Quach Lee
(74) *Attorney, Agent, or Firm* — Marshall, Gerstein & Borun LLP

(57) ABSTRACT

An LED module with a blue LED chip, over which is arranged a conversion layer, which has a luminous material mixture mixing a further proportion of greater wavelength into the blue light, so that a reddish or greenish or yellowish white light is emitted from the LED module, the emitted light of the LED module having a peak or secondary peak in the red or green or yellow range.

6 Claims, 4 Drawing Sheets

LED MODULE WITH APPLICATION-SPECIFIC COLOR SETTING

BACKGROUND OF THE INVENTION

1. Field of the Invention

The invention concerns an LED module, a corresponding lamp arrangement, and a goods display facility.

2. Related Technology

In shops, and in particular in food shops, white lighting with a high proportion of red, green, or yellow light is often used, to improve the goods presentation of, for instance, red, green, or yellow goods, e.g. meat, vegetables, or cheese. However, the disadvantages of known lighting arrangements, such as gas discharge lamps, are a damaging effect on the illuminated products by a high UV and IR proportion of the light.

SUMMARY OF THE INVENTION

Therefore, the invention improves the goods presentation, and simultaneously reduces damaging effects on or damage to the goods.

According to the invention, an LED module with a blue LED chip is provided, and over it a conversion layer, which has a luminous material mixture, which mixes a further proportion of greater wavelength into the blue light, is arranged, so that a reddish, yellowish, or greenish white light is emitted from the LED module, the emitted light of the LED module having a peak or secondary peak in the red, yellow, or green range.

Thus for different applications, by using blue LED chips in association with a special luminous material mixture, i.e. at least two different luminous materials, specific color nuances in the white range are set. In this way, a broad spectrum can be matched specifically to the application.

For instance, by a high proportion of red in the spectrum a meat lamp can be represented, for instance. The generated light includes no UV portion and only a very small IR portion. The broader spectrum in the red range ensures optimal reproduction of the meat colors. Thus the goods presentation of meat is improved, and simultaneously the goods are not damaged.

It is also possible, for instance, instead of the high red portion in the spectrum, to generate a specific color setting or specific spectrum in the green range for lighting vegetables, e.g. lettuce, or in the yellow range for lighting cheese products, likewise contributing to an ideal goods presentation.

The spectrum is not limited to matching the red range or yellow range or green range, but in principle can be matched to any color range according to the application, by using appropriate luminous materials. In particular, if blue LEDs are used, the spectrum to be matched should preferably have a greater wavelength than the blue light.

The invention also concerns a lamp arrangement, including, among other things, the LED module according to the invention, and a facility for displaying goods, which in turn includes among other things the above-mentioned lamp arrangement.

BRIEF DESCRIPTION OF THE DRAWINGS

Other features, advantages, and properties of the invention are explained below on the basis of embodiments and the figures of the accompanying drawings.

DETAILED DESCRIPTION

The invention concerns the generation of an application-specific reddish or yellowish or greenish light, especially for applications in markets, e.g. food markets, with blue LEDs in association with color conversion using luminous materials.

Similarly to the case of white-light generation, a blue LED with a wavelength of e.g. about 460 nm is encapsulated with the luminous material (luminous material with downward conversion of the blue light), to stimulate a color conversion. The luminous material converts part of the blue light from an LED chip into, for instance, red and/or yellow and/or green light. In particular, a luminous materials mixture, i.e. at least two different luminous materials, can be used for this purpose.

In this way a special spectrum is represented, for presentation of goods in the food market with LEDs, a "white" light with a high red or yellow or green portion being generated with blue LEDs and luminous material(s).

Preferably, the blue LED is the only light source, i.e. no other color (e.g. red, yellow or green) LED is used.

According to a first embodiment, the generation of a color spectrum, in particular for setting reddish color nuances in the white light range, of a meat lamp according to the invention is shown. The generated spectrum is shown in the graphic of FIG. 1, in comparison with traditional solutions.

In the case of illumination of meat goods, it is necessary to ensure that a broad peak is present in the red range. The difference from white light generation is therefore, according to the invention, in the composition and property of the luminous material used. In the first embodiment according to FIG. 1, a mixture of a first luminous material (luminous material 1) and a second luminous material (luminous material 2), which have different peaks, is chosen as the color conversion medium for the blue light of the LED. The peak of the first luminous material in the shown embodiment is in the region of 610 nm, and that of the second luminous material is in the region of 650 nm. For this purpose, luminous material 1 was mixed with luminous material 2 (e.g. BOSE-type luminous materials; carbidonitridosilicates) at the appropriate ratio. In this way a high red proportion in the lighting can be achieved, or a spectrum of the meat lamp can be represented.

Figure 1:
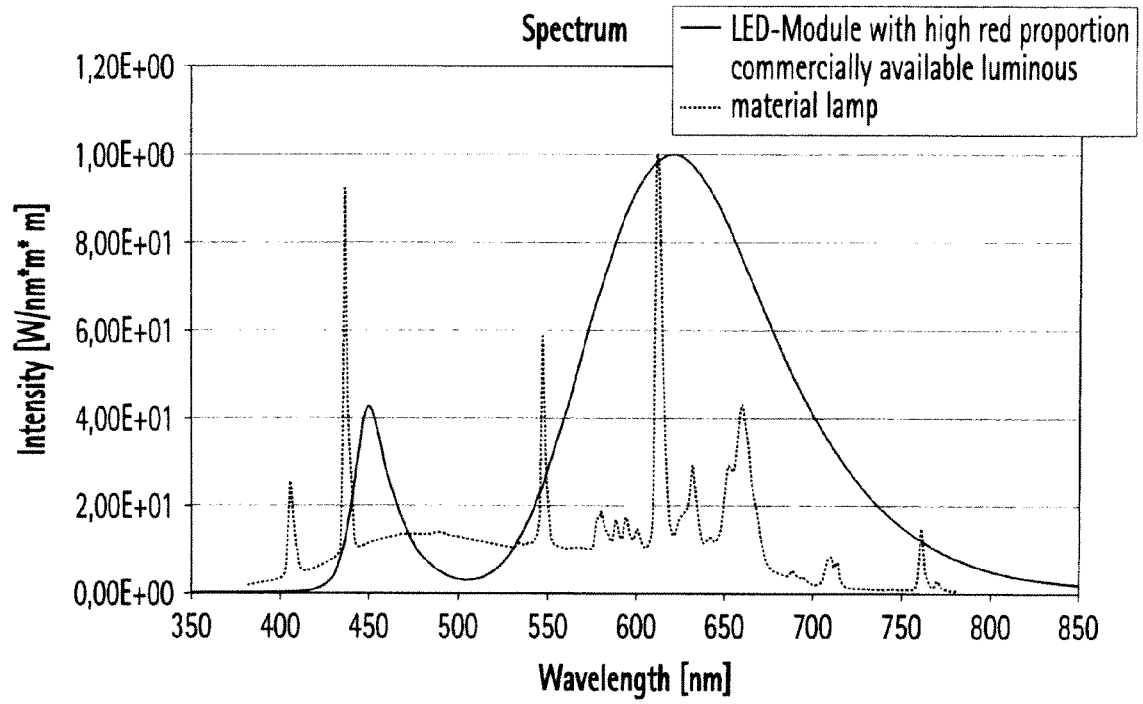
FIG. 1 shows a spectrum of a meat lamp according to the invention, with an appropriate mixture of luminous material 1 and luminous material 2, compared with traditional solutions.

In particular, as can also be inferred from FIG. 1, as well as the blue peak at about 460 nm there is an even higher peak in the red region, i.e. with a wavelength of, for instance, about 622 nm, and a spectral width of about 120 nm. The result, in addition to the blue peak, is a very broad spectrum, which covers all red tones. However, other luminous materials can also be mixed, to achieve a correspondingly broad spectrum for a meat lamp.

The mixture of the blue peak with the broad red spectrum gives a reddish white light.

Figure 2:
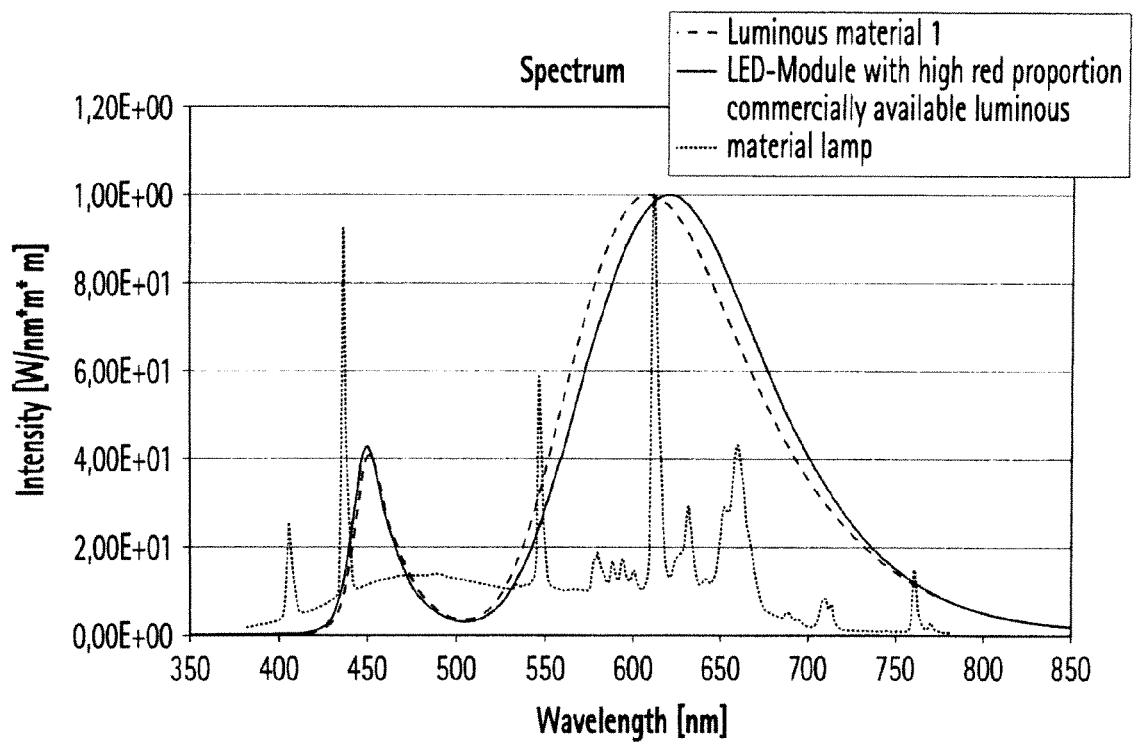
FIG. 2 shows a spectrum of a meat lamp according to the invention and FIG. 1, also in comparison with a meat lamp according to the invention with luminous material 1.

In FIG. 2, a spectrum as in FIG. 1 is shown, and is contrasted as an example with a spectrum of a meat lamp according to the invention with luminous material 1. In FIGS. 1 and 2, the spectra shown are also contrasted with a spectrum of a commercially available luminous material lamp.

Figure 3:
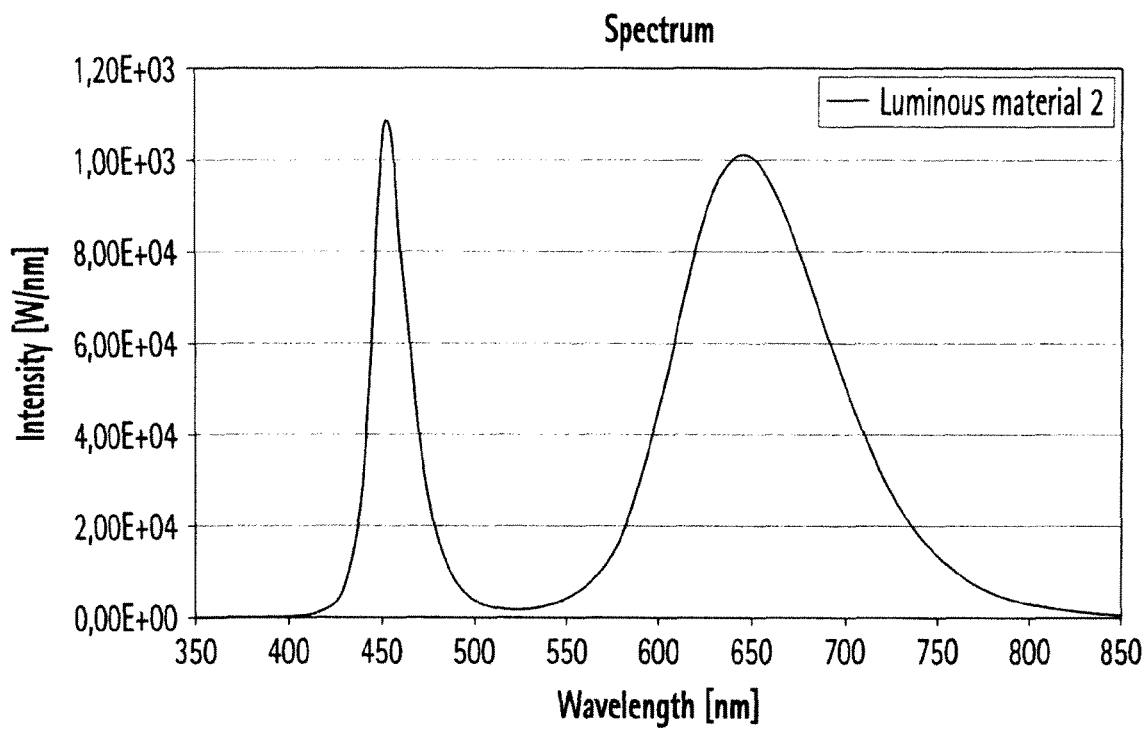
FIG. 3 shows a spectrum of a meat lamp according to the invention, with luminous material 2.
Figure 4:
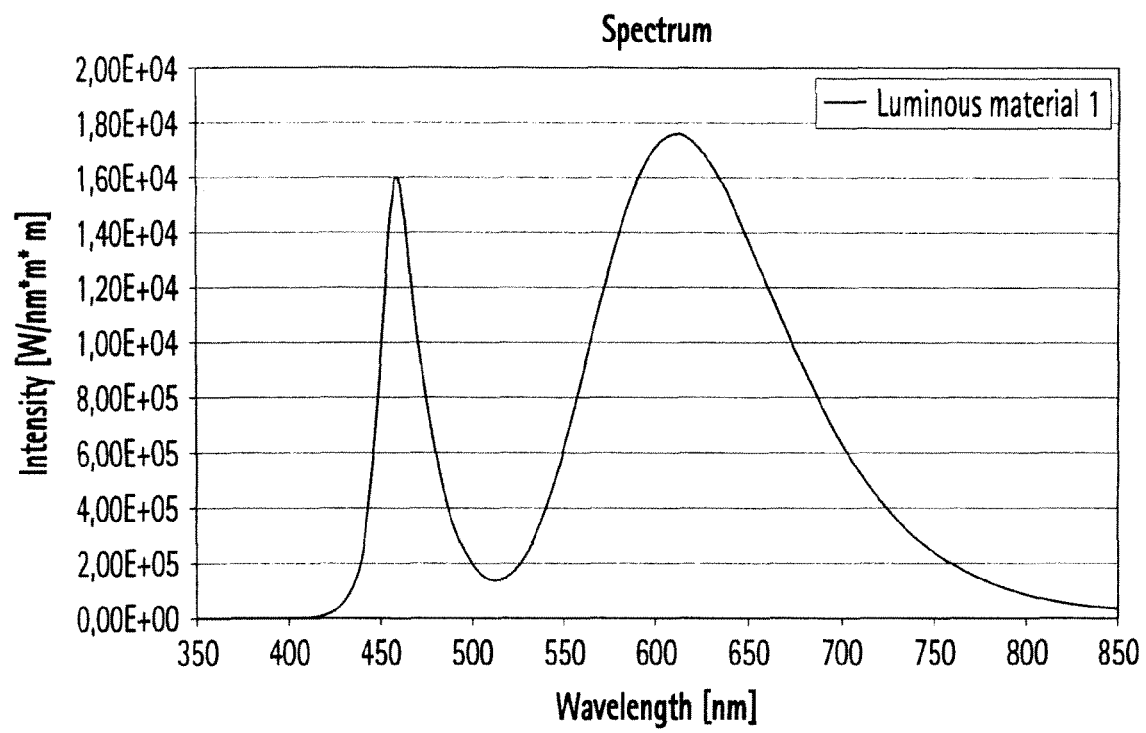
FIG. 4 shows a spectrum of a meat lamp according to the invention, with luminous material 1.

Additionally, in FIGS. 3 and 4, spectra of a meat lamp according to the invention with luminous material 1 (FIG. 3) and luminous material 2 (FIG. 4) are shown. Compared with FIGS. 1 and 2, these have different luminous power intensities, resulting in different ratios of the peak intensities of, for instance, 450 to 650 nm.

In a manner comparable to the first embodiment, in an application specifically for vegetables, lettuce, etc., in addition to the blue peak another peak, which covers the green spectrum, can be generated. Thus according to a second embodiment, the generation of a color spectrum, in particular with greenish color nuances, of a lettuce lamp according to the invention is shown.

The difference from the "pure" white light generation is likewise in the composition and property of the used luminous material. Here too, preferably at least two different luminous materials, each chosen from the green region, and having different peaks, are mixed.

According to an exemplary embodiment of the second variant, a luminous material 3 (approx. 525 nm) is mixed with a luminous material 1 in an appropriate ratio, to consequently achieve a high green proportion in the lighting, or to represent a spectrum with a high green proportion.

Thus, in addition to the blue peak at about 460 nm, there is also a secondary peak at a wavelength in the green range of, for instance, about 525 nm, and a spectral width of about 76 nm. The result, in addition to the blue peak, is a very broad spectrum, which covers all green tones. However, other luminous materials can also be mixed, to achieve a correspondingly broad spectrum for a lettuce lamp.

Figure 5:
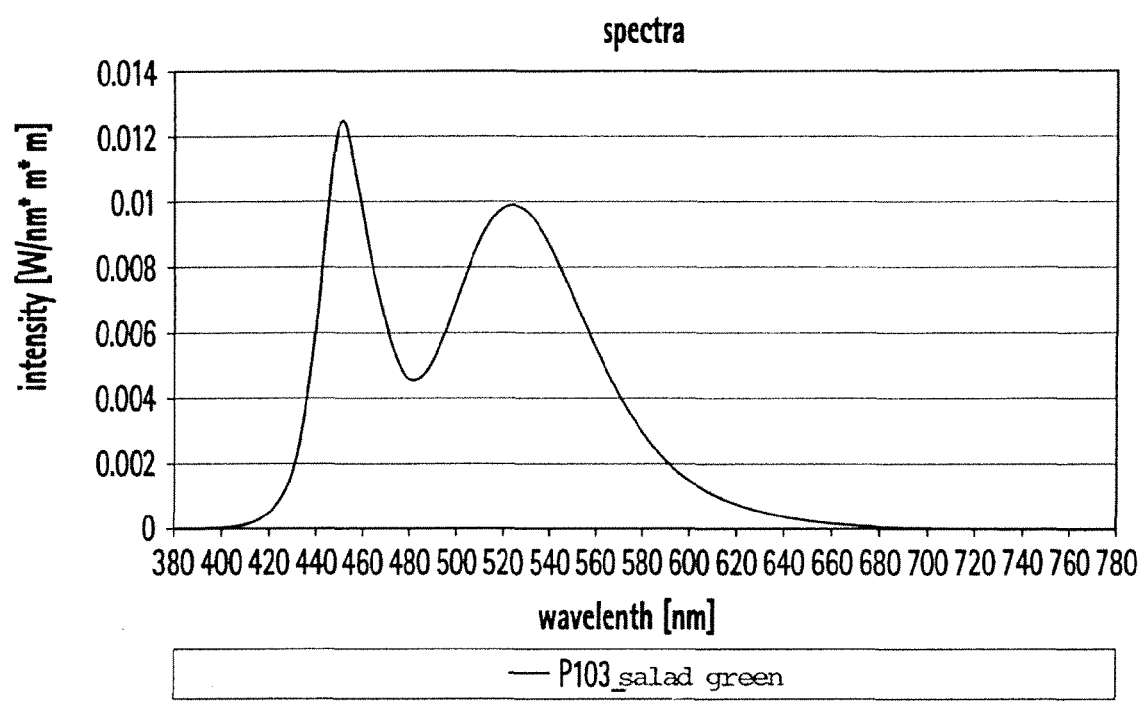
FIG. 5 shows a spectrum of a lettuce lamp according to the invention.

The mixture of the blue peak with the broad green spectrum gives a greenish white light. The generated spectrum is shown in the graphic according to FIG. 5.

Similarly, a yellowish white light and white light with a broad spectrum of light of different colors, in particular preferably having a greater wavelength than blue light, can be generated. However, it is also conceivable that it has a shorter wavelength than blue light, e.g. shorter wavelengths than about 460 nm.

The advantage in particular of using a blue LED for emphasizing particular colors by skilled choice of luminous material is that the spectrum includes no damaging UV or IV portion, which could affect the goods, in particular the food, and is yet suitable for ideal goods presentation.

Figure 6:
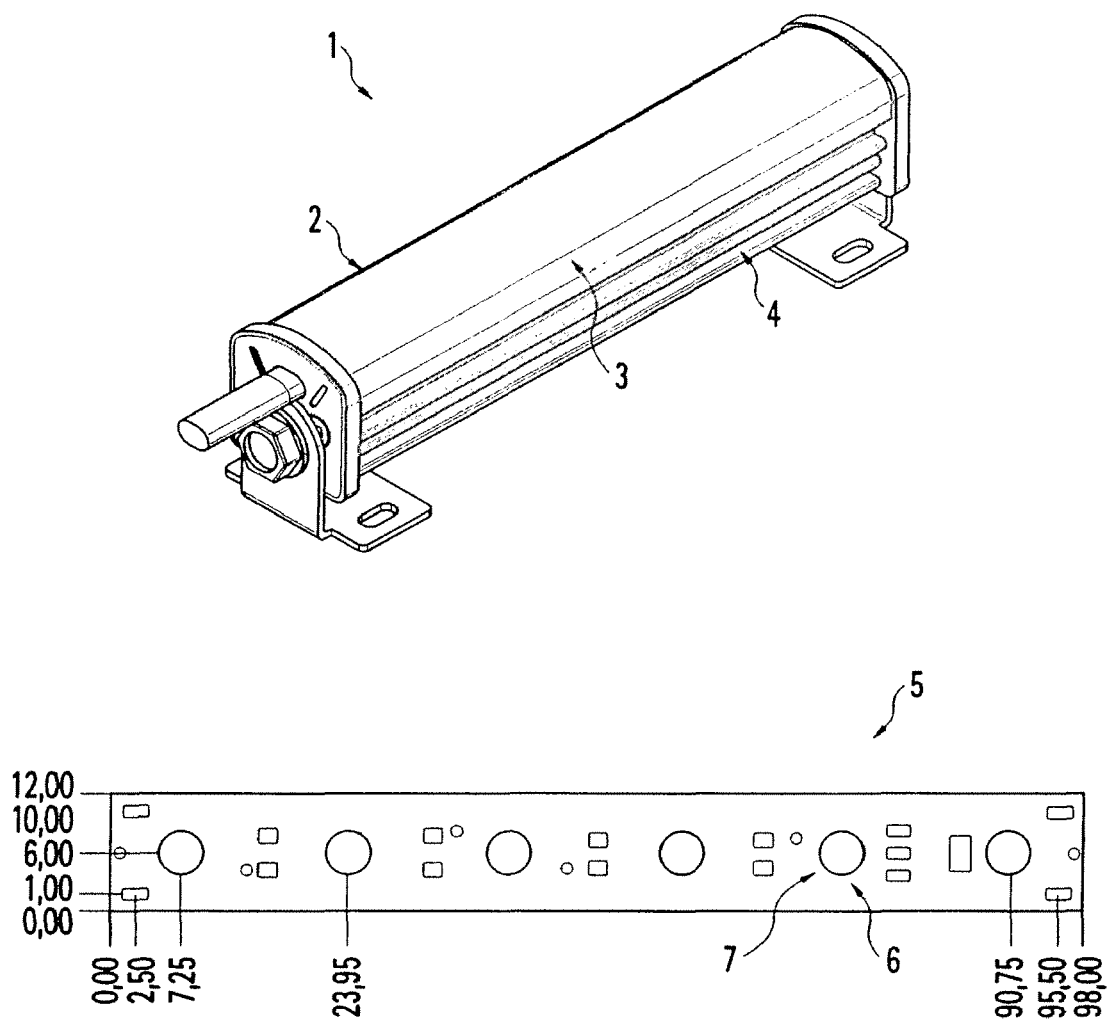
FIG. 6 shows a lamp arrangement having LED modules according to the invention.

In FIG. 6, as an example, a lamp arrangement 1 according to the invention is shown. The lamp arrangement 1 preferably has a cover or housing 2, a lens 3 inside it, and preferably an aluminum profile 4. The lamp arrangement also has LED modules 5 according to the invention, with special color settings, e.g. for lighting goods such as food. The LED modules 5 are preferably mounted in the housing 2, especially preferably on the aluminum profile 4 under the cover 2. The LED modules 5 preferably have at least one blue LED chip 6 under a glob top 7, through which an appropriate color conversion occurs.

In a specially preferred embodiment, a lamp arrangement according to the invention, having an LED module according to the invention, is arranged on a facility for displaying goods, e.g. food. The goods display facility can be, for instance, a goods shelf, a counter, a refrigerator or a freezer cabinet, in a shop or market, e.g. a food market. The facility has at least the lamp arrangement according to the invention and a goods display area for presenting and displaying the goods.

The invention claimed is:

1. Facility for displaying goods such as food, having:
   a goods display area for presenting and displaying the goods, and
   a lamp arrangement for lighting the goods, the lamp arrangement having:
      a housing or cover,
      a lens, and
      an LED module with a blue LED chip, over which is arranged a conversion layer, which has a luminous material mixture mixing a further proportion of greater wavelength into the blue light, so that a reddish or greenish or yellowish white light is emitted from the LED module, the emitted light of the LED module having a peak and at least a secondary peak in the red or green or yellow range, wherein the LED module is arranged in the housing, and wherein at least two different luminous materials, the luminous materials being chosen from the red region or green region or yellow region, and having different peaks, are mixed to obtain, in addition to the blue peak, a very broad spectrum, which covers all red tones or green tones or yellow tones.

2. Facility according to claim 1, wherein the goods display facility is a goods shelf, a counter, a refrigerator or a freezer cabinet.

3. Facility according to claim 1, wherein the lamp arrangement further comprises an aluminum profile and the LED module is mounted on the aluminum profile under the housing or cover.

4. Facility according to claim 1, wherein the LED module has at least one blue LED chip under a globe top, through which an appropriate color conversion occurs.

5. Facility for displaying goods such as food, having:
   a goods display area for presenting and displaying the goods, and
   a lamp arrangement for lighting the goods, the lamp arrangement having:
      a housing or cover,
      a lens, and
      an LED module with a blue LED chip, over which is arranged a conversion layer, which has a luminous material mixture mixing a further proportion of greater wavelength into the blue light, so that a reddish or greenish or yellowish white light is emitted from the LED module, the emitted light of the LED module having a peak and at least a secondary peak in the red range or green range or yellow range to generate a specific color setting or a specific spectrum in the red range, in the green range, and in the yellow range for lighting meat, vegetable, or cheese products, contributing to an ideal goods presentation, wherein the LED module is arranged in the housing.

6. Facility for displaying goods such as food, having:
   a goods display area for presenting and displaying the goods, and
   a lamp arrangement for lighting the goods, the lamp arrangement having:
      a housing or cover,
      a lens, and
      an LED module with a blue LED chip, over which is arranged a conversion layer, which has a luminous material mixture mixing a further proportion of greater wavelength into the blue light, so that a reddish or greenish or yellowish white light is emitted from the LED module, the emitted light of the LED module having a peak and at least a secondary peak in the red range or green range or yellow range to generate a specific color setting or a specific spectrum in the red range, in the green range, and in the yellow range for lighting meat, vegetable, or cheese products, contributing to an ideal goods presentation, wherein at least two different luminous materials, each chosen from the red region or green region or yellow region, and having different peaks, are mixed, and wherein the LED module is arranged in the housing.

* * * * *